United States Patent
Chou et al.

(10) Patent No.: US 9,893,254 B1
(45) Date of Patent: Feb. 13, 2018

(54) STRUCTURE OF HIGH TEMPERATURE RESISTANT REFLECTING LAYER OF LIGHT-EMITTING DIODE

(71) Applicant: HIGH POWER OPTO. INC., Taichung (TW)

(72) Inventors: Li-Ping Chou, Taichung (TW); Yen-Chin Wang, Taichung (TW); Jing-Kai Chiu, Taichung (TW); Wei-Yu Yen, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 0 days.

(21) Appl. No.: 15/492,614

(22) Filed: Apr. 20, 2017

(51) Int. Cl.
| | |
|---|---|
| H01L 33/40 | (2010.01) |
| H01L 33/60 | (2010.01) |
| H01L 33/44 | (2010.01) |
| H01L 33/48 | (2010.01) |
| H01L 33/46 | (2010.01) |
| H01L 33/10 | (2010.01) |

(52) U.S. Cl.
CPC .............. *H01L 33/60* (2013.01); *H01L 33/10* (2013.01); *H01L 33/405* (2013.01); *H01L 33/44* (2013.01); *H01L 33/46* (2013.01); *H01L 33/48* (2013.01); *H01L 33/483* (2013.01); *H01L 33/486* (2013.01)

(58) Field of Classification Search
None
See application file for complete search history.

(56) References Cited

U.S. PATENT DOCUMENTS

| | | | |
|---|---|---|---|
| 8,896,007 B2 | 11/2014 | Yen et al. | |
| 9,666,780 B2 * | 5/2017 | Tsai | ........................ H01L 33/62 |
| 2014/0151711 A1 * | 6/2014 | Yen | ........................ H01L 33/405 |
| | | | 257/76 |
| 2015/0171271 A1 * | 6/2015 | Inoue | ...................... H01L 33/38 |
| | | | 257/98 |
| 2015/0280073 A1 * | 10/2015 | Miyoshi | ................ H01L 33/405 |
| | | | 257/98 |
| 2015/0287886 A1 * | 10/2015 | Huang | ................... H01L 33/405 |
| | | | 257/98 |

* cited by examiner

*Primary Examiner* — Minh-Loan Tran
(74) *Attorney, Agent, or Firm* — Muncy, Geissler, Olds & Lowe, P.C.

(57) ABSTRACT

A structure is presented as a laminar structure having a first electrode, light-emitting diode epitaxial layer, silver reflecting layer, current barrier layer, metallic buffer layer, bonding layer, substrate and second electrode in turn, the silver reflecting layer covering the light-emitting diode epitaxial layer and having a bare region distributed as a pattern, the bare region being filled with a high temperature enduring reflecting material, the current barrier layer being patterned to be distributed over the silver reflecting layer in correspondence with the bare region, the metallic buffer layer separating the current barrier layer while covering the silver reflecting layer, whereby high temperature generated by the current barrier layer is sustained by the reflecting material to prevent the silver reflecting layer from cracking when being contacted with the high temperature of the current barrier layer and then ensure luminous efficiency of the light-emitting diode. Thus, the usage requirement is fulfilled.

8 Claims, 3 Drawing Sheets

STRUCTURE OF HIGH TEMPERATURE RESISTANT REFLECTING LAYER OF LIGHT-EMITTING DIODE

FIELD OF THE INVENTION

The present invention is related to a light-emitting diode, particularly to a structure of high temperature resistant reflecting layer of light-emitting diode

BACKGROUND OF THE INVENTION

Referring to U.S. Pat. No. 8,896,007 B2, as illustrated in FIG. 1, a conventional vertical light-emitting diode includes a N-type semiconductor layer 1, an active layer 2 and a P-type semiconductor layer 3, which constitute a sandwich structure. Under the P-type semiconductor layer 3, a metallic reflecting layer 4, a metallic buffer layer 5, a binding layer 6, a silicon substrate 7 and a P-type electrode 8 are provided in turn. Moreover, the surface of the N-type semiconductor layer 1 may be roughened so as to enhance luminous emittance, and provided for disposing a N-type electrode 9. Thereby, after a voltage is applied between the N-type electrode 9 and the P-type electrode 8, electrons are provided by the N-type semiconductor layer 1, while electron holes are provided by the P-type semiconductor layer 3. Light is generated, after the electrons and the electron holes are combined in the active layer 2.

In this conventional technology, a current barrier layer 10 is provided between the metallic reflecting layer 4 and the metallic buffer layer 5. The current barrier layer 10 is provided with higher resistance, allowing smaller current passing therethrough and further dispersing current, so as to enhance luminous uniformity and overall brightness. Moreover, for protecting the metallic reflecting layer 4, a protective layer 11 is further provided for sheltering the metallic reflecting layer 4, so as to prevent the metallic reflecting layer 4 from being oxidized to reduce reflectivity due to the subsequent manufacturing process.

However, the problem encountered by this conventional structure is that higher resistance is provided for the current barrier layer 10, such that higher temperature is readily generated in the current barrier layer 10 after this conventional structure is used for a long period of time. Thus, the metallic reflecting layer 4 contacted with the current barrier layer 10 is apt to crack when being contacted with high temperature. Thereby, reflectivity of the metallic reflecting layer 4 may be reduced significantly, and then, is impossible for fulfilling the usage requirement.

SUMMARY OF THE INVENTION

It is the main object of the present invention to disclose a structure of high temperature resistant reflecting layer of light-emitting diode, capable of sustaining local high temperature so as to maintain the integrity of the reflecting layer, in such a way that the effect of the reflecting layer is exploited certainly for ensuring luminous efficiency of the light-emitting diode.

The present invention is related to a structure of high temperature resistant reflecting layer of light-emitting diode presented as a laminar structure having a first electrode, a light-emitting diode epitaxial layer, a silver reflecting layer, a current barrier layer, a metallic buffer layer, a bonding layer, a substrate and a second electrode in turn. The technical feature of the present invention is characterized in that the silver reflecting layer is allowed for covering the light-emitting diode epitaxial layer and provided with a bare region distributed as a pattern, the bare region being filled with a high temperature enduring reflecting material, the current barrier layer being patterned to be distributed over the silver reflecting layer in correspondence with the bare region, the metallic buffer layer separating the current barrier layer while covering the silver reflecting layer.

Thereby, the sheltering and isolation provided by the high temperature enduring reflecting material may be utilized in the present invention to avoid the effect generated on the silver reflecting layer directly due to high temperature. In this case, high temperature generated by the current barrier layer is sustained by the high temperature enduring reflecting material, so as to prevent the silver reflecting layer from cracking when being contacted with the high temperature of the current barrier layer, so as to ensure the integrity of the silver reflecting layer, and ensure luminous efficiency of the light-emitting diode. Thus, the usage requirement is fulfilled.

DETAILED DESCRIPTION OF THE PREFERRED EMBODIMENTS

Figure 1:
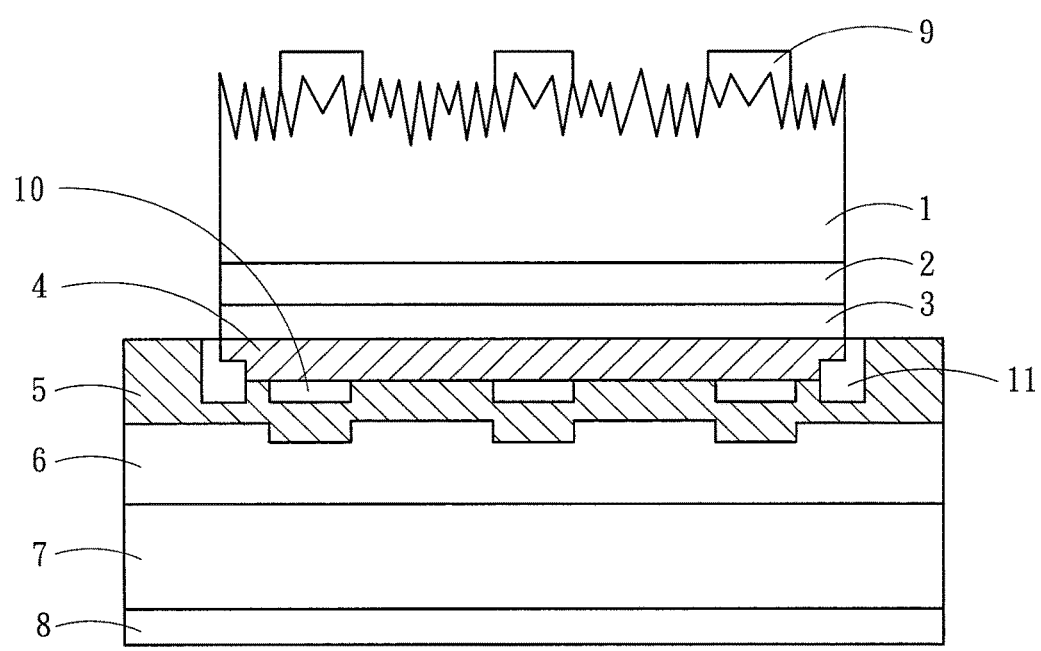
FIG. 1 is a structural diagram of a conventional light-emitting diode.

The detailed content and technical description related to the present invention are further described with respect to embodiments. However, it should be understood that the embodiments are only exemplary and should not be construed to limit the embodiments of the present invention.

Referring to FIG. 2A again, the present invention is related to a structure of high temperature resistant reflecting layer of light-emitting diode presented as a laminar structure having a first electrode 20, a light-emitting diode epitaxial layer 21, a silver reflecting layer 22, a current barrier layer 23, a metallic buffer layer 24, a bonding layer 25, a substrate 26 and a second electrode 27 in turn. In this case, the light-emitting diode epitaxial layer 21 may include a N-type semiconductor layer 211, an active layer 212 and a P-type semiconductor layer 213.

The technical feature of the present invention is characterized in that the silver reflecting layer 22 is allowed for covering the light-emitting diode epitaxial layer 21 and provided with a bare region 221 distributed as a pattern, the bare region 221 being filled with a high temperature enduring reflecting material 28, the current barrier layer 23 being patterned to be distributed over the silver reflecting layer 22 in correspondence with the bare region 221, the metallic buffer layer 24 separating the current barrier layer 23 while covering the silver reflecting layer 22.

Figure 2A:
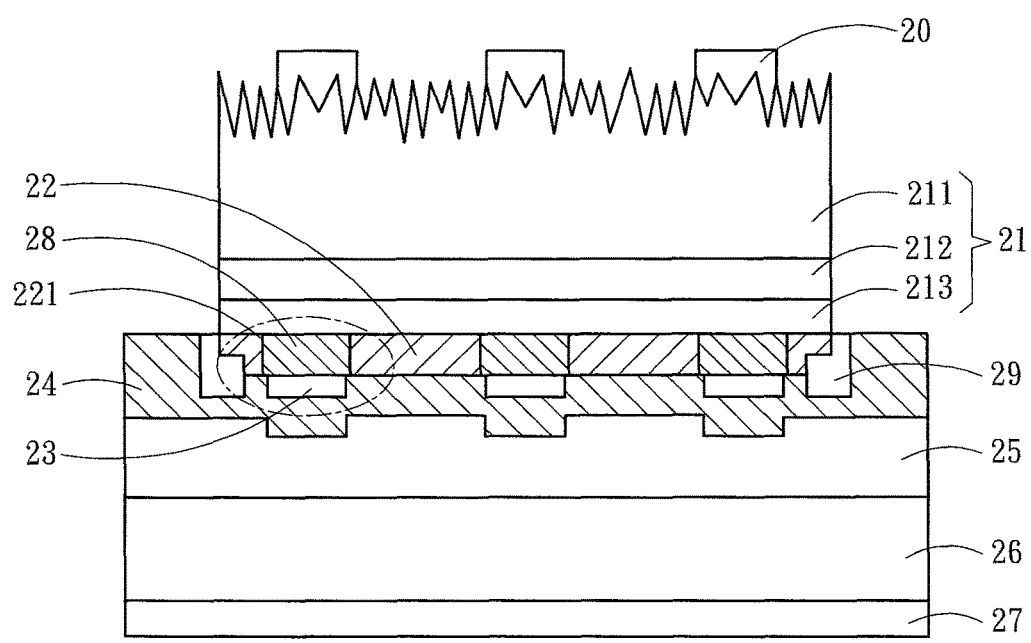
FIG. 2A is a structural diagram of a light-emitting diode of the present invention.
Figure 2B:
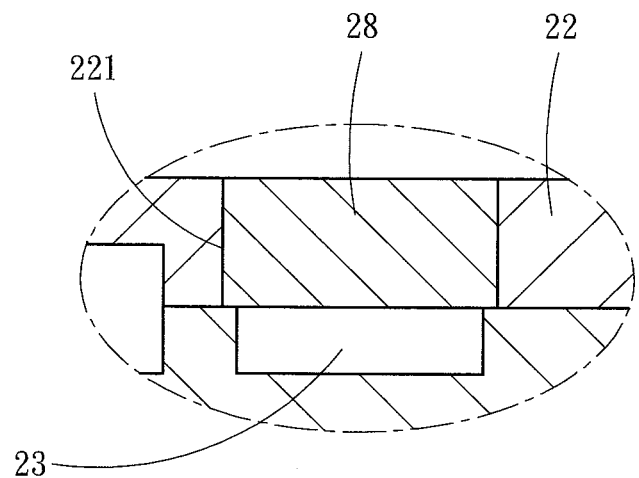
FIG. 2B is an enlarged partial view of FIG. 2A.
Figure 3:
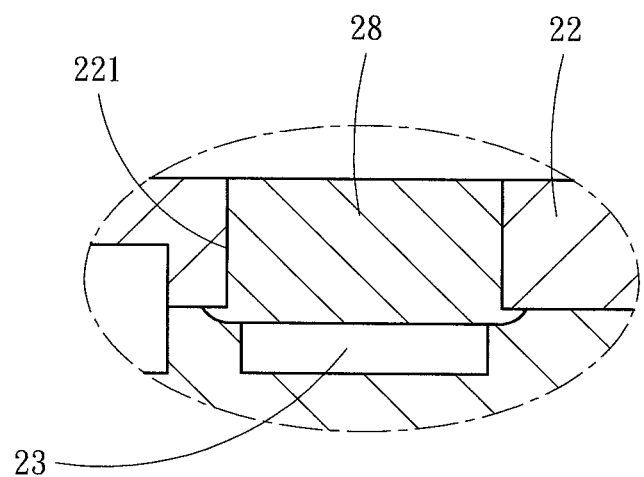
FIG. 3 is a surface schematic diagram of the surface of the high temperature enduring reflecting material is overlapped with the silver reflecting layer.

Referring to FIG. 2B together with FIG. 2A, for achieving a better effect of thermal isolation in terms of structure, the bare region 221 may be larger than the current barrier layer 23 in area, and allowed for covering the current barrier layer 23 completely, i.e., a small gap being between the current barrier layer 23 and the silver reflecting layer 22 so as to avoid the problem of thermal cracking arising in the silver reflecting layer 22 certainly. Moreover, for increasing reflection efficiency, the surface of the high temperature enduring reflecting material 28 and the surface of the silver reflecting layer 22 are flushed with each other at one side adjacent to the light-emitting diode epitaxial layer 21 in the best condition, so as to avoid a rugged surface. However, great difficulty in implementation is encountered in the manufacturing process. Therefore, as shown in FIG. 3, the surface of the high temperature enduring reflecting material 28 is overlapped with that of the silver reflecting layer 22.

Further, the high temperature enduring reflecting material 28 should be resistant to attack of high temperature, and may be selected from the group consisting of titanium (Ti), titanium platinum (TiPt), chrome (Cr), tungsten (W) and titanium tungsten (TiW). A poorer reflectivity with a considerably good thermal tolerance are provided for the material of such a group. In specific application fields, the high temperature enduring reflecting material 28 may be selected from the group consisting of palladium (Pd) and rhodium (Rh). In this connection, both the good reflectivity and thermal tolerance are provided, yet the cost is relatively high.

Moreover, for protecting the silver reflecting layer 22 from being oxidized in the subsequent manufacturing process, the silver reflecting layer 22 may be further provided on the periphery thereof with a protective layer 29. The silver reflecting layer 22 is covered by the protective layer 29, and thus, may be not exposed to avoid oxidation. In the selection of material, the protective layer 29 may be made of the material selected from the group consisting of silicon dioxide ($SiO_2$), titanium dioxide ($TiO_2$), silicon nitride (SiN) and chromium oxide (CrO). Only the resistance to oxidation and good compactness are required for the material.

As described above, the sheltering and isolation provided by the high temperature enduring reflecting material is utilized in the present invention primarily to avoid the effect generated on the silver reflecting layer directly due to high temperature. In this case, high temperature generated by the current barrier layer is sustained by the high temperature enduring reflecting material, so as to prevent the silver reflecting layer from cracking when being contacted with the high temperature of the current barrier layer. Moreover, the high temperature enduring reflecting material is also a reflecting material capable of providing considerable reflectivity, so as to ensure the integrity of the silver reflecting layer, and ensure luminous efficiency of the light-emitting diode. Thus, the usage requirement is fulfilled.

What is claimed is:

1. A structure of high temperature resistant reflecting layer of light-emitting diode presented as a laminar structure having a first electrode, a light-emitting diode epitaxial layer, a silver reflecting layer, a current barrier layer, a metallic buffer layer, a bonding layer, a substrate and a second electrode in turn, characterized in that:

said silver reflecting layer is allowed for covering said light-emitting diode epitaxial layer and provided with a bare region distributed as a pattern, said bare region being filled with a high temperature enduring reflecting material, said current barrier layer being patterned to be distributed over said silver reflecting layer in correspondence with said bare region, said metallic buffer layer separating said current barrier layer while covering said silver reflecting layer.

2. The structure of high temperature resistant reflecting layer of light-emitting diode according to claim 1, wherein said silver reflecting layer is further provided on the periphery thereof with a protective layer.

3. The structure of high temperature resistant reflecting layer of light-emitting diode according to claim 1, wherein said high temperature enduring reflecting material is selected from the group consisting of titanium (Ti), titanium platinum (TiPt), chrome (Cr), tungsten (W) and titanium tungsten (TiW).

4. The structure of high temperature resistant reflecting layer of light-emitting diode according to claim 1, wherein said high temperature enduring reflecting material is selected from the group consisting of palladium (Pd) and rhodium (Rh).

5. The structure of high temperature resistant reflecting layer of light-emitting diode according to claim 1, wherein said protective layer is made of material selected from the group consisting of silicon dioxide ($SiO_2$), titanium dioxide ($TiO_2$), silicon nitride (SiN) and chromium oxide (CrO).

6. The structure of high temperature resistant reflecting layer of light-emitting diode according to claim 1, wherein said bare region is larger than said current barrier layer in area, and allowed for covering said current barrier layer completely.

7. The structure of high temperature resistant reflecting layer of light-emitting diode according to claim 1, wherein the surface of said high temperature enduring reflecting material and the surface of said silver reflecting layer are flushed with each other at one side adjacent to said light-emitting diode epitaxial layer.

8. The structure of high temperature resistant reflecting layer of light-emitting diode according to claim 1, wherein the surface of said high temperature enduring reflecting material is overlapped with that of said silver reflecting layer.

* * * * *